(12) United States Patent
Chen

(10) Patent No.: US 11,776,654 B2
(45) Date of Patent: Oct. 3, 2023

(54) FAIL BIT REPAIR SOLUTION DETERMINATION METHOD AND DEVICE

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 211 days.

(21) Appl. No.: 17/412,372

(22) Filed: Aug. 26, 2021

(65) Prior Publication Data
US 2022/0084620 A1    Mar. 17, 2022

Related U.S. Application Data

(63) Continuation of application No. PCT/CN2021/100004, filed on Jun. 15, 2021.

(30) Foreign Application Priority Data

Sep. 11, 2020   (CN) .......................... 202010955742.5

(51) Int. Cl.
*G11C 29/00* (2006.01)
*G11C 29/36* (2006.01)
(Continued)

(52) U.S. Cl.
CPC .......... *G11C 29/4401* (2013.01); *G11C 29/36* (2013.01); *G11C 29/785* (2013.01);
(Continued)

(58) Field of Classification Search
CPC ... G11C 29/4401; G11C 29/36; G11C 29/785; G11C 29/802; G11C 2029/1202; G11C 2029/1208
(Continued)

(56) References Cited

U.S. PATENT DOCUMENTS 6,516,433 B1 *  2/2003  Koenig .................. H01L 22/20
                                                    714/736
9,778,984 B1 * 10/2017  Plants .................... G11C 29/42
(Continued)

FOREIGN PATENT DOCUMENTS

CN     103077749 A    5/2013
CN     107039084 A    8/2017
(Continued)

*Primary Examiner* — Ly D Pham
(74) *Attorney, Agent, or Firm* — Cooper Legal Group, LLC

(57) ABSTRACT

Provided are a Fail Bit (FB) repair solution determination method and device, which are applied to a chip including multiple subdomains. The chip further includes Redundancy (RD) circuits, and the RD circuits are configured to repair FBs in the subdomains. The method includes that: after one or more available RD circuits are determined for a target FB presently to be repaired in a subdomain, a reliability value of each available RD circuit is acquired from an RD circuit reliability list, the RD circuit reliability list including reliability values of multiple RD circuits, and a repair solution for the target FB in the subdomain is determined according to the reliability value of the available RD circuit. The reliability value of the RD circuit is obtained by performing big data analysis on relationships between generated FBs and RD circuits where NFBs are located in the RD circuits.

18 Claims, 10 Drawing Sheets

(51) Int. Cl.
*G11C 29/44* (2006.01)
*G11C 29/12* (2006.01)

(52) U.S. Cl.
CPC .... *G11C 29/802* (2013.01); *G11C 2029/1202* (2013.01); *G11C 2029/1208* (2013.01)

(58) Field of Classification Search
USPC .................................................. 365/185.09
See application file for complete search history.

(56) References Cited

U.S. PATENT DOCUMENTS

| | | | |
|---|---|---|---|
| 2004/0015651 A1 | 1/2004 | Chadwick | |
| 2013/0016895 A1* | 1/2013 | Song | G06T 7/0004 382/149 |
| 2020/0227133 A1* | 7/2020 | Shih | G11C 29/765 |

FOREIGN PATENT DOCUMENTS

| | | |
|---|---|---|
| CN | 109741782 A | 5/2019 |
| CN | 110968985 A | 4/2020 |

* cited by examiner

⊕   NFB

▬   RD circuit where the NFB is located

✦   FB

FAIL BIT REPAIR SOLUTION DETERMINATION METHOD AND DEVICE

CROSS-REFERENCE TO RELATED APPLICATIONS

This is continuation of international application PCT/CN2021/100004, filed on Jun. 15, 2021, which claims priority to Chinese Patent Application No. 202010955742.5, filed with CNIPA on Sep. 11, 2020 and entitled "Fail Bit Repair Solution Determination Method". The contents of international application PCT/CN2021/100004 and Chinese Patent Application No. 202010955742.5 are hereby incorporated by reference in their entireties.

TECHNICAL FIELD

The disclosure relates to the technical field of integrated circuits, and particularly to an FB repair solution determination method and device.

BACKGROUND

A failure problem of a chip during development, production, and use is inevitable, and a position of a First Bit (FB) in the chip may be learned from Circuit Probe/Chip Probe (CP).

At present, repair processing may be performed on the FB in the chip using a Redundancy (RD) circuit. However, an FB may be generated after the CP, and the FB generated after the CP is called a New FB (NFB).

Generation of an NFB in an RD circuit means an FB repair failure. Consequently, the repair efficiency and repair accuracy of FBs are relatively low.

SUMMARY

The disclosure provides an FB repair solution determination method and device.

A first aspect of the disclosure provides an FB repair solution determination method, which may be applied to a chip including multiple subdomains, the chip further including RD circuits, and the RD circuits being configured to repair FBs in the subdomains. The method may include the following operations.

A CP result of the chip is acquired, the CP result including position information of FBs in the chip, and the FBs in the chip including the FBs in the subdomains and FBs in the RD circuits.

An available RD circuit for repairing a target FB in a subdomain in the CP result is determined.

A reliability value of the available RD circuit is acquired from a pre-acquired RD circuit reliability list, the RD circuit reliability list including reliability values of multiple RD circuits.

A repair solution for the target FB is determined according to the reliability value of the available RD circuit.

A second aspect of the disclosure provides an electronic device, comprising a processor and a memory. The memory is configured to store a program code. The processor is configured to call the program code stored in the memory to execute the method described above.

A third aspect of the disclosure provides a computer-readable storage medium, storing an instruction therein, the instruction running in a computer to enable the computer to execute the method described above.

A fourth aspect of the disclosure provides a computer program, comprising a program code. When a computer runs the computer program, the program code executes the method described above.

DETAILED DESCRIPTION

A chip usually includes a large number of bits. Exemplarily, a typical Dynamic Random Access Memory (DRAM) chip includes 64 million bits, these bits may be arranged in rows and columns to form an array, and the bits in the array may be addressed through word lines and bit lines.

In the manufacturing process of a DRAM chip, some bits in a Main Array (MA) in the formed chip may be defected, namely they are FBs. For improving the yield of the chip, RD circuits may usually be made on the chip, and the RD circuits may replace the defected FBs to ensure that storage circuits may be used normally.

An RD bit is also called a backup circuit. The RD circuit is further classified into Global RD (GR) circuit and Local RD (LR) circuit. The GR circuit is configured to repair FBs in any subdomain in a corresponding target global domain and an adjacent global domain of the target global domain. The LR circuit is configured to repair FBs in a target subdomain to which the target RD circuit belongs and an adjacent subdomain of the target subdomain. The GR circuit may be an RWL, also called a column RD circuit. The LR circuit may be an RBL, also called a row RD circuit.

In the embodiments of the disclosure, subdomain is a minimum repair unit (or called a minimum repair region) for FB repair, and global domain is a repair unit larger than subdomain. A global domain consists of multiple continuous subdomains in a word line direction.

Figure 1:
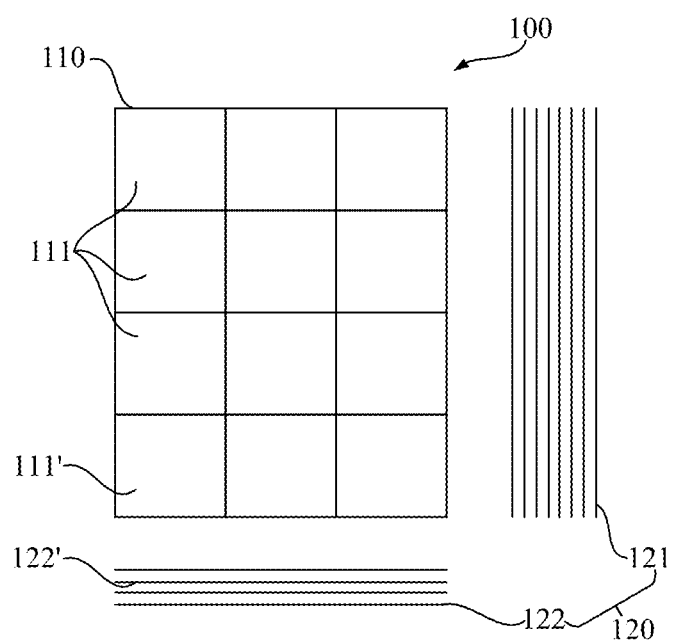
FIG. 1 is a structure diagram of a chip applied by embodiments of the disclosure.

FIG. 1 is a structure diagram of a chip applied by the embodiments of the disclosure. Referring to FIG. 1, the chip 100 includes an MA region 110 and an RD unit region 120. The RD unit region 120 is configured to repair the MA region 110. Since the chip 100 includes a relatively large number of bits, for improving the repair efficiency, an MA, i.e., the MA region 110, of the chip 100 may be divided into multiple subdomains 111, and each subdomain 111 may include a certain number of bits. The RD unit region 120 includes a GR circuit 121 and an LR circuit 122. The GR circuit 121 is configured to repair an FB in any subdomain 111. The LR circuit 122 is configured to repair an FB in a specified subdomain 111. For example, as shown in FIG. 1, an LR circuit 122' may repair an FB in a subdomain 111' only.

Optionally, referring to FIG. 1, the GR circuit 121 is a column RD circuit, and may be configured to replace a word line, thereby repairing an FB on the word line. A GR circuit 121 may simultaneously repair multiple FBs on a word line. The LR circuit 122 is a row RD circuit, and may be configured to replace a bit line, thereby repairing an FB on the bit line. An LR circuit 122 may simultaneously repair multiple FBs on a bit line.

In the related art, all FBs in a chip may be detected in a CP stage, and the FBs may be generated in subdomains and RD circuits of the chip, so that the FBs obtained by a CP include FBs in the subdomains of the chip and FBs in the RD circuits of the chip. The corresponding RD circuits may be allocated to repair the FBs in the subdomains in a redundant allocation stage. However, FBs may be generated in the RD circuits after the CP. Generation of NFBs in the RD circuits allocated to the FBs in the subdomains causes a failure in repairing the FBs in the subdomains.

In the embodiments of the disclosure, the FB detected in the CP stage is called an FB, and the FB generated after the CP is called an NFB. It can be understood that the FBs generated in the two different stages may also be distinguished by other names. For example, the FB detected in the CP stage is called a first-type FB, and the FB generated after the CP is called a second-type FB. In some embodiments, the FB detected in the CP stage is called a first FB, and the FB generated after the CP is called a second FB. No limits are made thereto in the embodiments.

In the embodiments of the disclosure, for avoiding allocation of RD circuits where NFBs may be generated to the FBs in the subdomains in the redundant allocation stage, statistics is made to an FB test result (i.e., CP result) and a NFB test result of the chip to obtain FB test data (which may also be called historical FB test data) and NFB test data (which may also be called historical NFB test data), bit data analysis is performed on the FB test data and NFB test data of the chip to mine conditions of NFBs formed in all the RD circuits after the CP under the influence of an FB position distribution of the chip formed during the CP, these conditions form fail modes (which may also be called bit fail modes), a reliability value of each RD circuit is further obtained according to the fail modes, and a repair solution for the FBs in the subdomains obtained by the present CP may subsequently be determined according to the reliability values of the RD circuits, namely the RD circuits with high reliability are preferentially allocated to the FBs in the subdomains. Therefore, the repair efficiency and repair accuracy of the FBs in the subdomains are improved.

Figure 2:
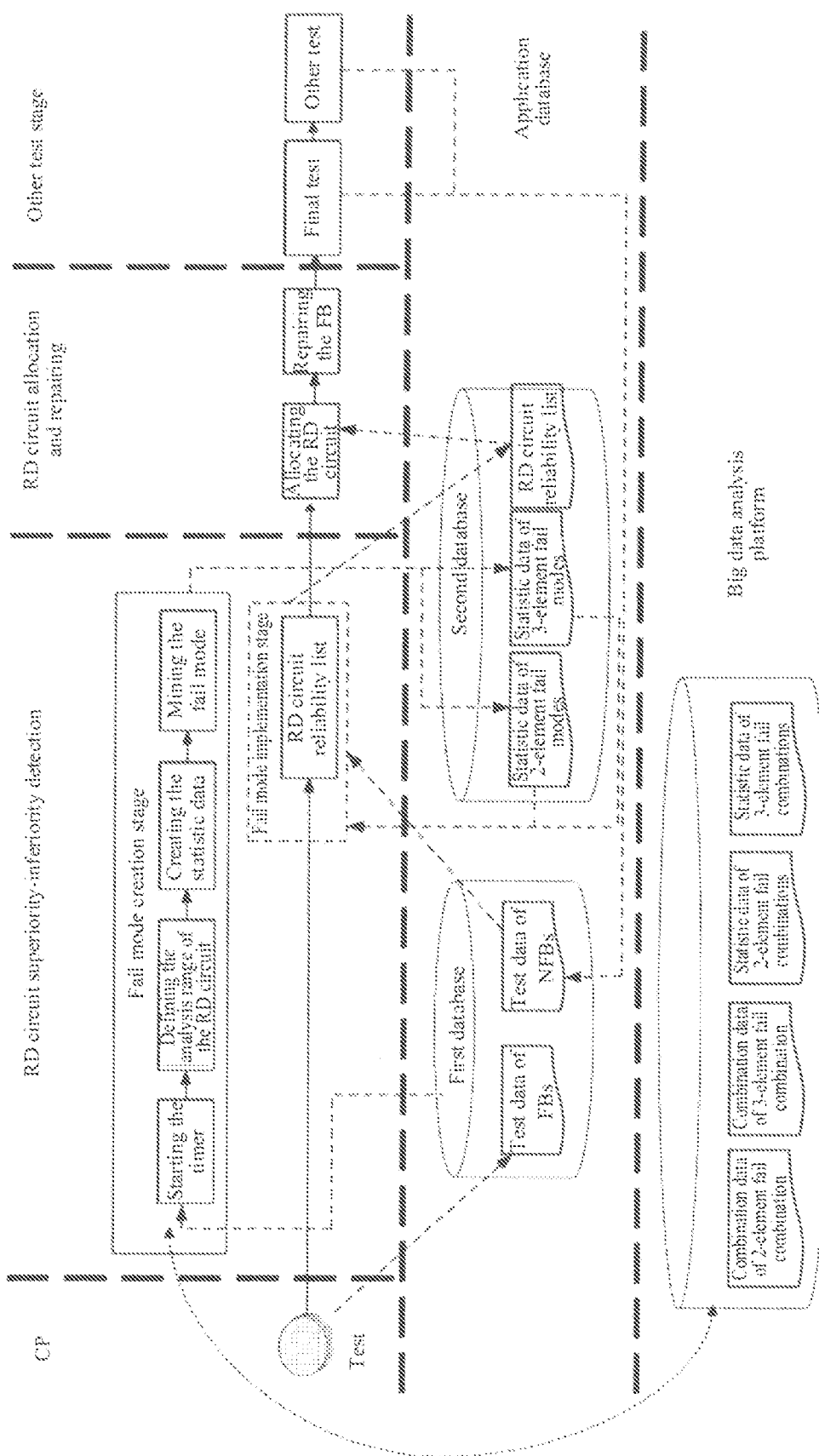
FIG. 2 is a schematic diagram of a chip detection and repair process provided by the disclosure.

FIG. 2 is a schematic diagram of a chip detection and repair process provided by the disclosure. As shown in FIG. 2, a chip manufacturing process includes a CP stage, an RD circuit superiority-inferiority detection stage, an RD circuit allocation stage, and other test stages.

A CP result is obtained through CP. The CP result includes position information of FBs in a chip. The FBs in the chip include FBs in subdomains and FBs in RD circuits. The position information of the FBs is stored in an application database. The application database includes a first database and a second database. The first database stores the FB test data and NFB test data. The position information of the FBs is specifically stored in the FB test data. The second database stores statistic data of 2-element fail modes, statistic data of 3-element fail modes, and an RD circuit reliability list.

The NFB test data includes a historical NFB test result of the chip. The NFB test result is obtained by measurement after FBs are repaired, namely obtained by measuring the chip in other test stages in FIG. 2. NFBs may still be generated for bits in the subdomains and bits in the RD circuits in the other test stage, so that NFBs of the chip also include NFBs in the subdomains and NFBs in the RD circuits. The NFB test result includes NFB information. Information of the NFB in the RD circuit includes a position of the NFB, and a type and position information of the RD circuit where the NFB is located. The type of the RD circuit may include an RWL and an RBL.

The RD circuit superiority-inferiority detection stage is a stage which is newly added in the disclosure. In the related art, the RD circuit allocation stage is directly executed after the CP. In the embodiments of the disclosure, through the added RD circuit superiority-inferiority detection stage, a reliability value of each RD circuit in the chip may be obtained, and RD circuits are subsequently allocated to the FBs in the subdomains according to the reliability values of the RD circuits in the RD circuit allocation stage.

Optionally, the RD circuit superiority-inferiority detection stage is divided into two sub-stages: a fail mode creation stage and a fail mode implementation stage.

Optionally, the fail mode creation stage includes the following four processes: starting a timer, defining analysis ranges of the RD circuits, creating statistic data, and mining fail modes.

The process of starting the timer is for acquiring more unknown fail modes or updating occurrence numbers of created fail modes. The timer may be started at fixed time to acquire more unknown fail modes or update the occurrence numbers of the created fail modes. Since the FB test data and NFB test data of the chip are continuously updated, more unknown fail modes may appear, the created fail modes may also appear in other chips after the fail modes are created, and the occurrence numbers of the created fail modes also keep changing. Therefore, both of them are required to be continuously updated.

The process of defining the analysis ranges of the RD circuits is for defining ranges, affected by FB positions of the chip, of various types of RD circuits. The analysis range may change according to different chips. A common type of the RD circuit includes the RWL and the RBL.

Figure 3:
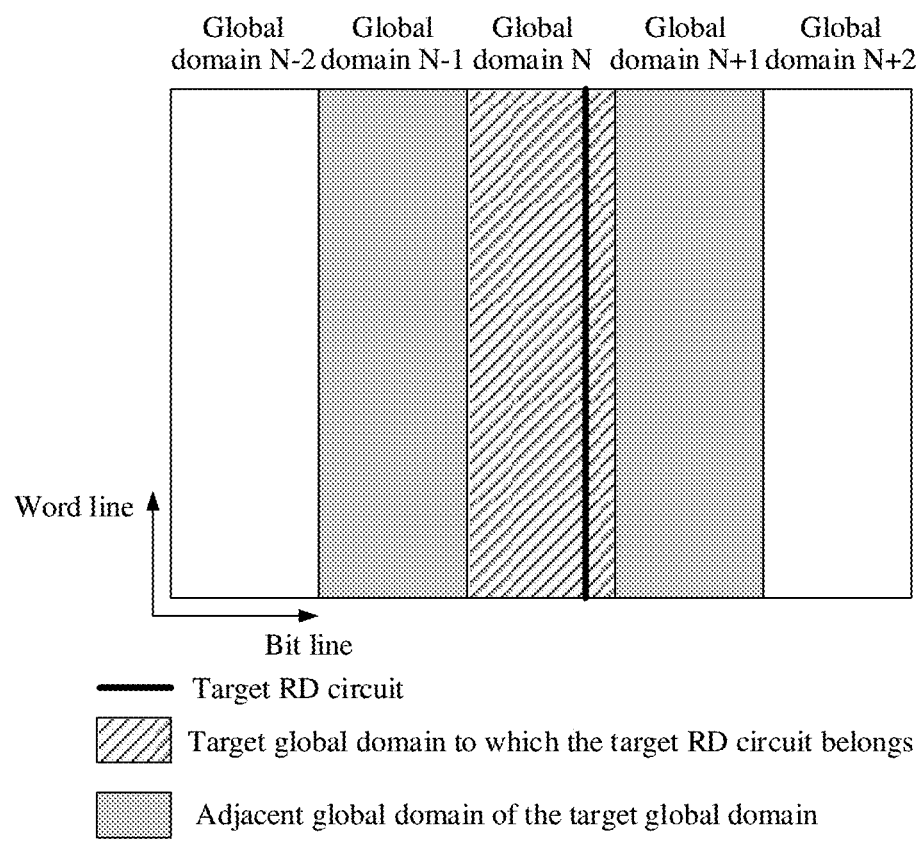
FIG. 3 is a schematic diagram of an analysis range of a Redundant Word Line (RWL).

When the RD circuit is an RWL, exemplarily, the analysis range of the RD circuit is a global domain (also called a section) to which the RD circuit belongs and an adjacent global domain of the global domain to which the RD circuit belongs. The global domain to which the RD circuit belongs may be called a target global domain. FIG. 3 is a schematic diagram of an analysis range of an RWL. As shown in FIG. 3, bits of the chip are divided into multiple regions in a bit line direction, and the bits of the chip are not divided in a word line direction. In such a division manner, multiple global domains are formed.

Referring to FIG. 3, if the global domain to which the RD circuit belongs is N, there are two adjacent global domains of global domain N, i.e., global domain N−1 and global domain N+1 respectively.

Figure 4:
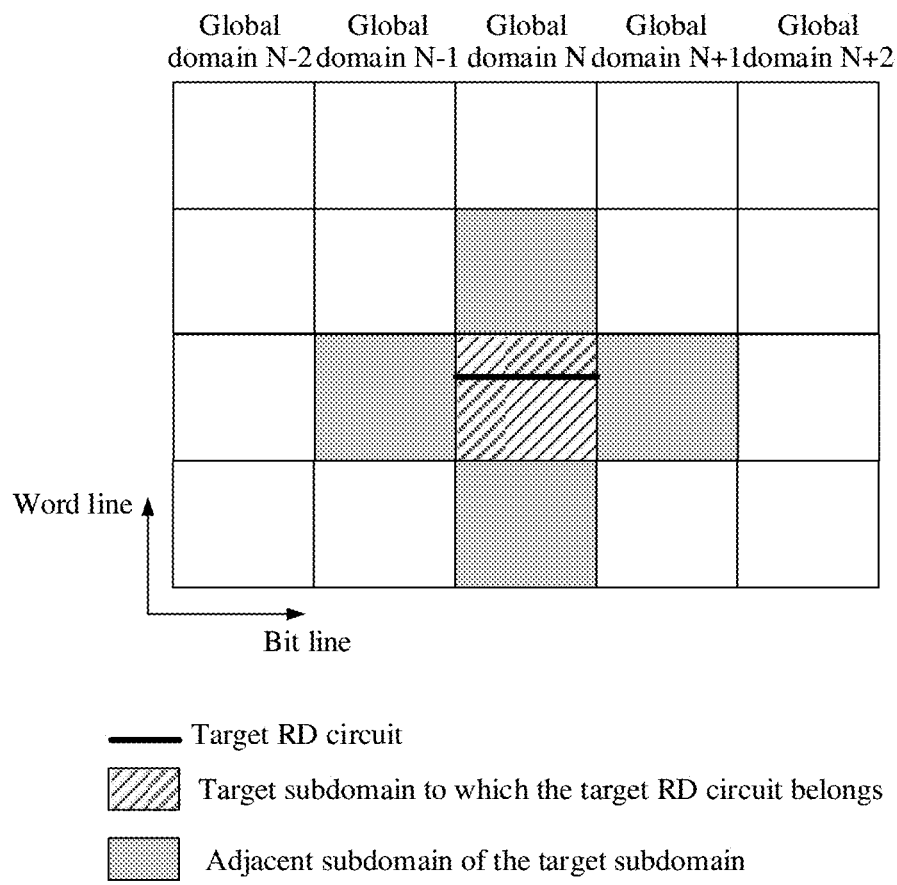
FIG. 4 is a schematic diagram of an analysis range of a Redundant Bit Line (RBL).

When the RD circuit is an RBL, exemplarily, the analysis range of the RD circuit is a subdomain to which the RD circuit belongs and an adjacent subdomain of the subdomain to which the RD circuit belongs. The subdomain to which the RD circuit belongs may be called a target subdomain. FIG. 4 is a schematic diagram of an analysis range of an RBL. As shown in FIG. 4, the bits of the chip are divided into multiple regions in the bit line direction, and the bits of the chip are also divided into multiple regions in the word line direction. In such a division manner, multiple subdomains are formed.

It can be seen from FIG. 3 and FIG. 4 that the subdomain is a region smaller than the global domain, one global domain may be divided into multiple smaller regions in the word line direction to form subdomains, or multiple continuous subdomains in the word line direction form one global domain. In the example shown in FIG. 4, each global domain includes four subdomains with the same size. Here is only exemplary description. The number of subdomains included in one global domain is not limited in the embodiment.

Referring to FIG. 4, there are totally four adjacent subdomains for the subdomain to which the RD circuit belongs, i.e., subdomains adjacent to the top, bottom, left, and right of the subdomain to which the RD circuit belongs respectively. It can be understood that, when the RD circuit is at an edge position of the chip, the number of the adjacent subdomains of the subdomain to which the RD circuit belongs may be less than 4. For example, when the RD circuit is in a first row of a global domain N, there is no subdomain at the top of the RD circuit, so there are three adjacent subdomains for the RD circuit. When the backup circuit is in a first row of a global domain N–3, there are no subdomains on the left and top of the RD circuit, so there are only two adjacent subdomains for the RD circuit.

In the embodiment, there may be or may not be RWLs in a global domain. The global domain is classified into two types according to whether there is RWLs in the global domain. The global domain of one type includes an MA and RBLs but no RWLs. The global domain of the other type includes an MA, RBLs, and RWLs.

Correspondingly, the RD circuits in the chip also include LR circuits and GR circuits. A LR circuit may repair FBs in the corresponding subdomain only. A GR circuit may repair FBs in any subdomain in the corresponding global domain.

The statistic data is created to acquire a fail combination formed by an RD circuit where each NFB is located and an FB in a statistic range of the RD circuit where the NFB is located in NFB test data of the RD circuit. A presently detected NFB is called a target NFB. Information of the target NFB is read from the NFB test data. The information of the NFB includes a type of an RD circuit where the target NFB is located and a position of the RD circuit. The RD circuit where the target NFB is located may be called a target RD circuit.

An analysis range of the target RD circuit is determined according to the type of the target RD circuit. An FB in the analysis range of the target RD circuit is acquired from the FB test data of the chip. A fail combination is formed according to the target RD circuit and the FB in the analysis range of the target RD circuit. Each fail combination includes the target RD circuit and at least one FB in the analysis range of the target RD circuit.

An n-element fail combination may be formed according to the number of elements (including NFBs and FBs) in the fail combination. The value of n is 2 to m. A maximum value of m is related to the number of FBs in the analysis range of the target RD circuit. For example, if the number of the FBs in the analysis range of the target RD circuit is 4, the maximum value of m is 5. In practical use, the value of n may be less than the maximum value of m. For example, a requirement may be met when n is valued to 2 and 3 under a normal condition, namely only a corresponding 2-element fail combination and 3-element fail combination are required to be determined for each NFB.

Figure 5:
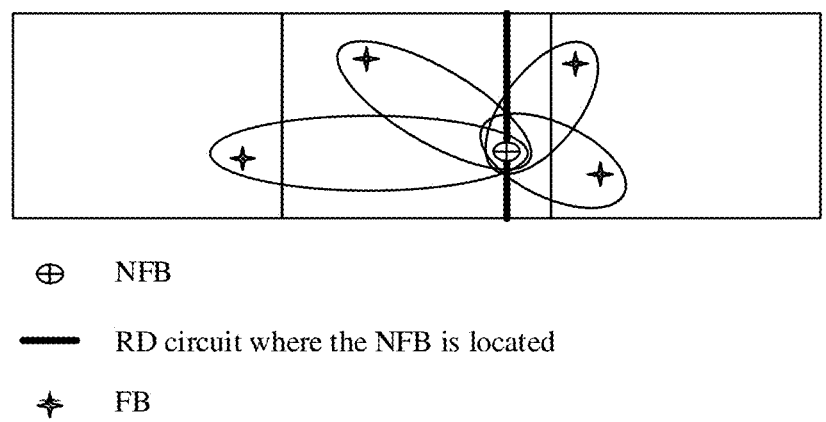
FIG. 5 is a schematic diagram of a 2-element fail combination.

FIG. 5 is a schematic diagram of a 2-element fail combination. As shown in FIG. 5, there are totally four FBs in the analysis range of the target RD circuit, the RD circuit where the NFB is located forms one 2-element fail combination with one FB in the analysis range, and totally four 2-element fail combinations may be formed.

Figure 6:
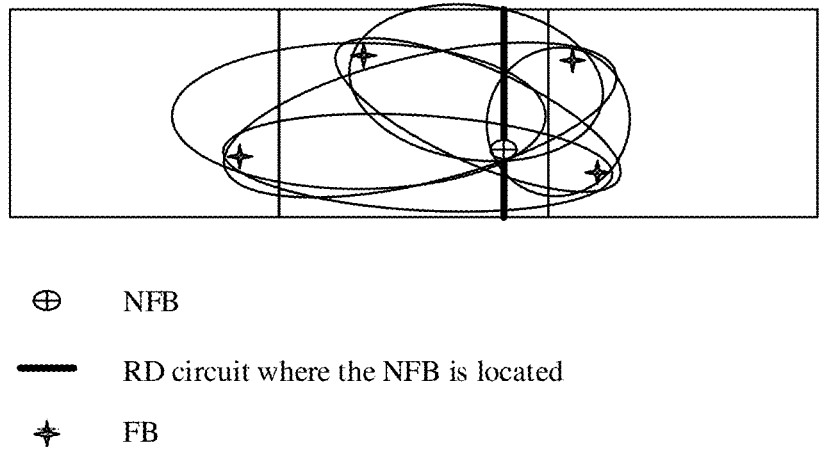
FIG. 6 is a schematic diagram of a 3-element fail combination.

FIG. 6 is a schematic diagram of a 3-element fail combination. As shown in FIG. 6, there are totally four FBs in the analysis range of the target RD circuit, the RD circuit where the NFB is located forms one 3-element fail combination with two FBs in the analysis range, and totally six 3-element fail combinations may be formed.

Here is only exemplary description. When there are totally four FBs in the analysis range of the target RD circuit, 4-element fail combinations and a 5-element fail combination may also be formed. The 4-element fail combination is formed by the RD circuit where the NFB is located and three FBs in the analysis range. The 5-element fail combination is formed by the RD circuit where the NFB is located and four FBs in the analysis range. However, with the increase of the number of elements in the fail combination, the number of the formed fail combinations is reduced. For example, when m is 5, the number of the 4-element fail combinations is 2, and the number of the 5-element fail combination is 1.

After the n-element fail combination is determined, combination data of the n-element fail combination is stored. The combination data of the n-element fail combination may be stored in a big data analysis platform. Exemplarily, the big data analysis platform stores combination data of 2-element fail combinations and combination data of 3-element fail combinations, and also stores statistic data of the 2-element fail combinations and statistic data of the 3-element fail combinations.

The combination data of the fail combination is configured to describe the type of the RD circuit where the NFB is located and a relative positional relationship between the RD circuit and the FB. Exemplarily, the combination data of the 2-element fail combination is arranged as $<x_1, x_2, x_3>$ for storage. $x_1$ represents the type of the RD circuit where the NFB is located. When the type of the RD circuit where the NFB is located is the RWL, $x_2$ represents a relative position of the global domain to which the FB belongs relative to the global domain to which the RD circuit where the NFB is located belongs. When the type of the RD circuit where the NFB is located is the RBL, $x_2$ represents a relative position of the subdomain to which the FB belongs relative to the subdomain to which the RD circuit where the NFB is located belongs. $x_3$ is a minimum distance between the position of the FB and the RD circuit where the NFB is located.

Exemplarily, the combination data of the 3-element fail combination is arranged as $<x_1, x_2, x_3, x_4>$ for storage. $x_1$ represents the type of the RD circuit where the NFB is located. When the type of the RD circuit where the NFB is located is the RWL, $x_2$ represents the relative position of the global domain to which the FB belongs relative to the global domain to which the RD circuit where the NFB is located belongs.

When the type of the RD circuit where the NFB is located is the RBL, $x_2$ represents the relative position of the subdomain to which the FB belongs relative to the subdomain to which the RD circuit where the NFB is located belongs.

$x_3$ is a minimum distance between the position of the FB at a lower position in two FBs and the RD circuit where the NFB is located. $x_4$ is a minimum distance between the position of the FB at a higher position in the two FBs and the RD circuit where the NFB is located. The lower position and the higher position are relative to a position of the same bit line.

After all NFBs in the NFB test data are detected, the statistic data of the n-element fail combinations is updated according to the combination data of the n-element fail combinations. The statistic data of the n-element fail combinations is configured to count a total occurrence number of each fail combination. In the statistic data of the n-element fail combinations, a unique identifier or number may be allocated to each fail combination to uniquely identify the fail combination.

Exemplarily, an occurrence number of each fail combination in the 2-element fail combinations is determined according to the combination data of the 2-element fail combinations. The 2-element fail combinations include one or more different fail combinations. The occurrence number of each fail combination may be obtained through the Structured Query Language (SQL) grammar. If the statistic data of the 2-element fail combinations include the fail combination, the occurrence number of the fail combination is accumulated to a total occurrence number of the fail combination in the statistic data. If the statistic data of the 2-element fail combinations does not include the fail combination, a number or identifier is allocated to the fail combination, and the occurrence number of the fail combination is accumulated to the total occurrence number of the fail combination in the statistic data. The statistic data of the 3-element fail combinations is updated according to the same method. Elaborations are omitted here.

In the process of mining the fail modes, n-element fail modes are obtained according to the statistic data of the n-element fail combinations, and statistic data of the n-element fail modes is stored. The statistic data of the n-element fail combinations includes multiple fail combinations, and only a fail combination that satisfies a certain condition may be determined as a fail mode. For example, the fail combination of which the total occurrence number is greater than a threshold value in the statistic data of the n-element fail combinations is determined as an n-element fail mode. Therefore, the statistic data of the n-element fail modes includes the number and total occurrence number of each fail combination.

For example, 2-element fail modes may be obtained according to the statistic data of the 2-element fail combinations, and 3-element fail modes may be obtained according to the statistic data of the 3-element fail combinations. If the statistic data of the 2-element fail combinations includes totally 10 fail combinations, and total occurrence numbers of only four fail combinations are greater than the threshold value, the four fail combinations of which the total occurrence number is greater than the threshold value are determined as 2-element fail modes.

In the fail mode implementation stage, a reliability value is determined or estimated for each RD circuit in the chip according to the acquired fail modes. The reliability value may range from 0 to 1. When the reliability value is 0, it indicates that the RD circuit is absolutely unreliable. If the reliability value is higher, it indicates that the RD circuit is more reliable. If the reliability of the RD circuit is higher, it indicates that the possibility of generating NFBs in the RD circuit is lower. If the reliability value of the RD circuit is lower, it indicates that the possibility of generating NFBs in the RD circuit is higher.

The reliability value of each RD circuit in the chip may be stored in the RD circuit reliability list. The RD circuits may subsequently be allocated to the FBs in the subdomains according to the reliability value of each RD circuit in the RD circuit reliability list. RD circuits with high reliability are preferentially allocated to the FBs in the subdomains. The possibility of subsequently generating NFBs in the RD circuit with higher reliability is lower. Therefore, the repair efficiency and repair accuracy of the FBs are improved.

Figure 7:
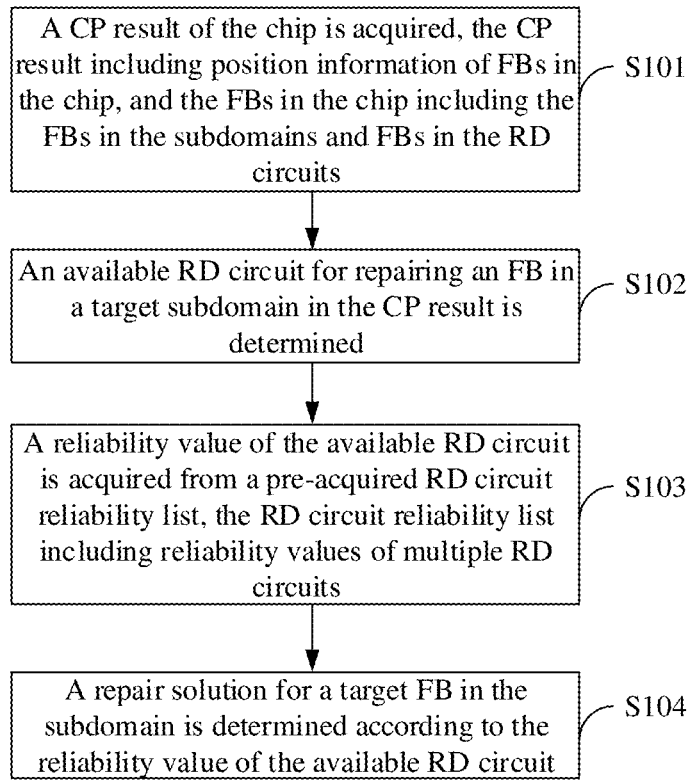
FIG. 7 is a flowchart of an FB repair solution determination method provided by embodiment 1 of the disclosure.

FIG. 7 is a flowchart of an FB repair solution determination method according to embodiment 1 of the disclosure. The method of the embodiment is applied to a chip including multiple subdomains, for example, the chip shown in FIG. 1. The chip further includes RD circuits, and the RD circuits are configured to repair FBs in the subdomains. As shown in FIG. 7, the method of the embodiment may include the following operations.

In S101, a CP result of the chip is acquired, the CP result including position information of FBs in the chip, and the FBs in the chip including the FBs in the subdomains and FBs in the RD circuits.

The CP result may be a result directly obtained from a test program or a test module, or may be acquired from test data of the FBs in the chip in a database. The test program or module stores the CP result in the database after performing a CP.

In S102, an available RD circuit for repairing an FB in a target subdomain in the CP result is determined.

The CP result may include position information of the FBs in the multiple subdomains. An FB in a subdomain may be sequentially selected from the CP result as a target FB presently to be repaired according to a certain sequence, and the available RD circuit for repairing the target FB is determined. When the available RD circuit for repairing the target FB is determined, the available RD circuit for repairing the target FB may be determined using any existing method. No limits are made thereto in the embodiment. For example, the available RD circuit for repairing the target FB is determined according to a position of the target FB and the number and types of the remaining unallocated RD circuits that are not allocated in the chip. The number of the available RD circuit for repairing the target FB is one or multiple.

In S103, a reliability value of the available RD circuit is acquired from a pre-acquired RD circuit reliability list, the RD circuit reliability list including reliability values of multiple RD circuits.

The RD circuit reliability list includes the reliability values of the multiple RD circuits in the chip. Exemplarily, the reliability value may be 0 to 1. If the value is higher, it indicates that the reliability is higher. The reliability of the available RD circuit may be acquired from the RD circuit reliability list.

The RD circuit reliability list may be created and sent by another device to an electronic device that executes the method of the embodiment, or may be created by the electronic device that executes the method of the embodiment.

Optionally, the RD circuit reliability list is created before S103. Exemplarily, the RD circuit reliability list may be created according to test data of fail units in the chip and statistic data of detected fail modes in the database The reliability value of each RD circuit in the chip is determined according to the test data of the FBs in the chip and the statistic data of the detected fail modes in the database, and the reliability value of each RD circuit in the chip is stored in the RD circuit reliability list.

The statistic data of the fail mode includes an identifier of a fail combination and a total occurrence number of the fail combination. A fail combination is formed by an RD circuit where an NFB is located and at least one FB in a statistic range of the RD circuit where the NFB is located. The test data of the FBs in the chip includes multiple CP results. The fail mode is obtained by counting a generated NFB in an RD circuit and an FB in a statistic range of the RD circuit where the NFB is located.

In S104, a repair solution for a target FB in the subdomain is determined according to the reliability value of the available RD circuit.

Determining the repair solution for the target FB in the subdomain refers to selecting a target RD circuit for the target FB in the subdomain from the available RD circuit and determining the target RD circuit as a repair circuit for the target FB in the subdomain.

When there are multiple available RD circuits for the target FB in the subdomain, the RD circuit with highest reliability is selected from the multiple available RD circuits as the target RD circuit. When there is only one available RD circuit for the target FB in the subdomain, the available RD circuit is determined as the target RD circuit.

In the embodiment, after one or more available RD circuits are determined for the target FB presently to be repaired in the subdomain, the reliability value of each available RD circuit is acquired from the RD circuit reliability list, the RD circuit reliability list including the reliability values of the multiple RD circuits, and the repair solution for the target FB in the subdomain is determined according to the reliability value of the available RD circuit. The reliability of RD circuits allocated to repair the FBs in the subdomains by the method is high, so that the repair efficiency and repair accuracy of the FBs are improved.

Figure 8:
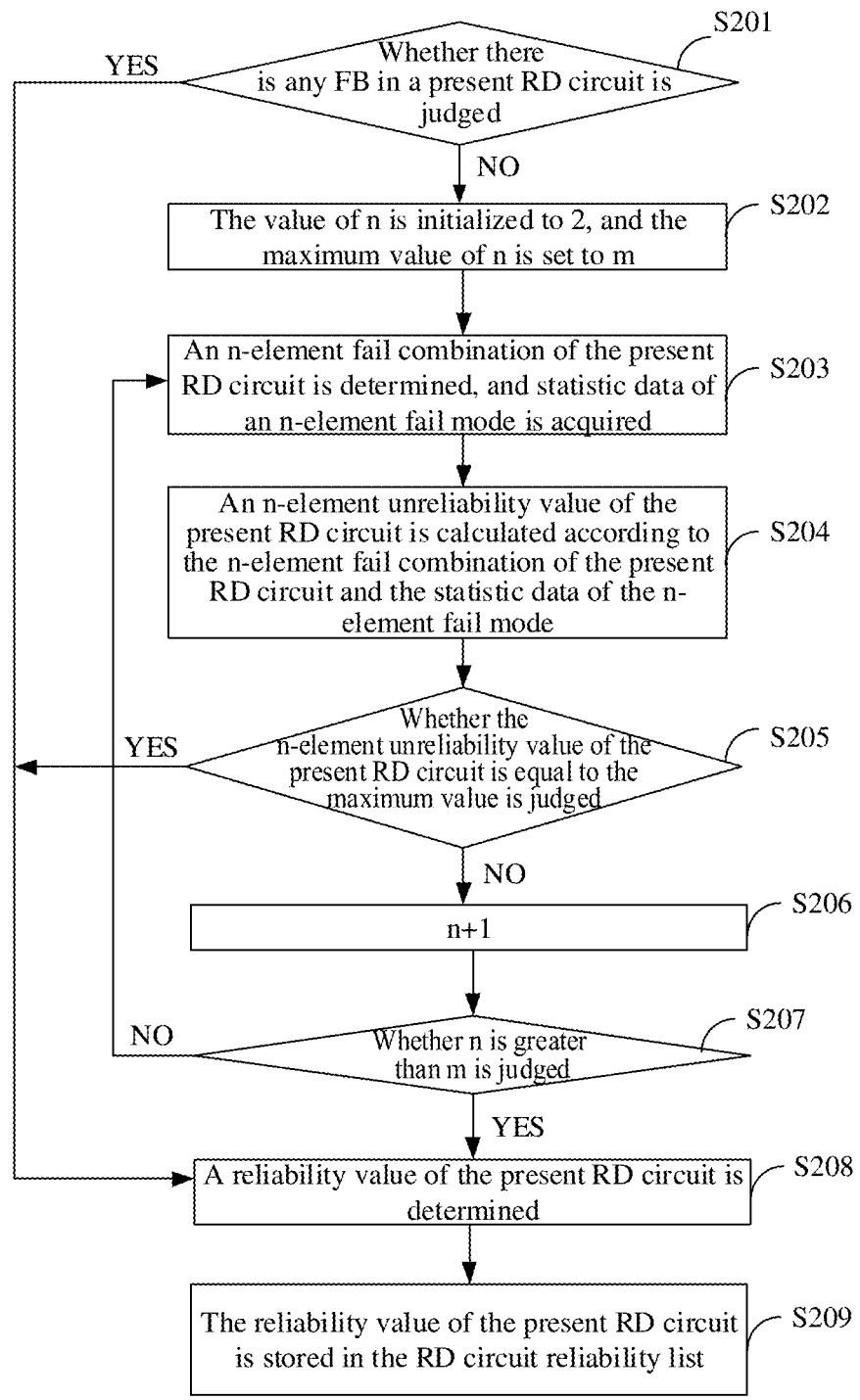
FIG. 8 is a flowchart of a method for determining a reliability value of an RD circuit according to embodiment 2 of the disclosure.

Based on embodiment 2, how to create the RD circuit reliability list, namely how to determine the reliability value of each RD circuit in the chip according to the test data of the FBs in the chip and the statistic data of the detected fail modes will be introduced in the present embodiment in detail. FIG. 8 is a flowchart of a method for determining a reliability value of an RD circuit according to embodiment 2 of the disclosure. As shown in FIG. 8, the method provided in the embodiment includes the following operations.

In S201, whether there is any FB in a present RD circuit is judged.

The method of the embodiment may be executed sequentially on each RD circuit in the chip. The test data of the FBs in the chip is read from the database at first. Whether there is any FB in the present RD circuit is determined according to a position of the present RD circuit and positions of the FBs in the chip. If there is no FB in the present RD circuit, S202 is executed. If there is an FB in the present RD circuit, S208 is executed.

In S202, the value of n is initialized to 2, and the maximum value of n is set to m.

In the embodiment, the value of n is 2≤n≤m, and m is an integer.

In S203, an n-element fail combination of the present RD circuit is determined, and statistic data of an n-element fail mode is acquired.

The n-element fail combination of the present RD circuit is formed by the present RD circuit and at least one FB in a statistic range of the present RD circuit. A specific manner for determining the n-element fail combination of the present RD circuit in the step may refer to the abovementioned manner for determining the n-element fail combination of the RD circuit in the statistic data creation stage, and will not be elaborated herein.

When the value of n is 2, a 2-element fail combination is determined for the present RD circuit, and a 2-element fail mode is read from the database. When the value of n is 3, a 3-element fail combination is determined for the present RD circuit, and a 3-element fail mode is read from the database.

In S204, an n-element unreliability value of the present RD circuit is calculated according to the n-element fail combination of the present RD circuit and the statistic data of the n-element fail mode.

Exemplarily, an unreliability value of each n-element fail combination of the present RD circuit is determined according to the n-element fail combination of the present RD circuit and the statistic data of the n-element fail mode, and then the n-element unreliability value of the present RD circuit is calculated according to a sum of the unreliability values of the n-element fail combinations of the present RD circuit.

The n-element fail combination of the present RD circuit may include multiple n-element fail combinations. For example, the 2-element fail combination of the present RD circuit includes multiple 2-element fail combinations, each fail combination includes two elements, but positions of FBs in each fail combination are different.

Correspondingly, for an i-th n-element fail combination of the present RD circuit, when the i-th n-element fail combination belongs to the n-element fail mode, the unreliability of the i-th n-element fail combination is highest. Optionally, a maximum unreliability value may be 1. When the i-th n-element fail combination does not belong to the n-element fail mode, the unreliability of the i-th n-element fail combination is calculated according to the following formula: $f_n(x_i, q_i) = q_i \times \max(q)^{-1}$, where $x_i$ represents the i-th n-element fail combination, $q_i$ represents a total occurrence number of the i-th n-element fail combination, $\max(q)$ represents a maximum value in the total occurrence number of the multiple n-element fail combinations of the present RD circuit, and $\max(q)^{-1}$ represents minus first power of $\max(q)$.

The operation that the n-element unreliability value of the present RD circuit is calculated according to the sum of the unreliability values of the n-element fail combinations of the present RD circuit may be implemented as follows: the greater value in the sum of the unreliability values of the n-element fail combinations of the present RD circuit and the maximum value of the unreliability value is determined as the n-element unreliability value of the present RD circuit.

Exemplarily, when the maximum value of the unreliability value is 1, the n-element unreliability value Q of the present RD circuit may be represented by the following formula: $Q = \max [1, \Sigma_1^L f_n(x_i, q_i)]$, where L represents the number of the n-element fail combinations in the present RD circuit.

In S205, whether the n-element unreliability value of the present RD circuit is equal to the maximum value is judged.

When the n-element unreliability value of the present RD circuit is equal to the maximum value, S208 is executed. When the n-element unreliability value of the present RD circuit is less than the maximum value, S206 is executed.

In S206, n is increased by 1.

Increasing n by 1 means switching the fail combination. The 2-element fail combination is switched to the 3-element fail combination, or, the 3-element fail combination is switched to the 2-element fail combination.

In S207, whether n is greater than m is judged.

If n is not greater than m, S203 is re-executed. If n is greater than m, S208 is executed.

In S208, a reliability value of the present RD circuit is determined.

Optionally, the reliability value of the present RD circuit is determined according to m−1 n-element unreliability values of the present RD circuit. For example, when m is 4, a 2-element unreliability value, 3 element unreliability value, and 4-element unreliability value of the present RD circuit are calculated through the abovementioned operations, and the reliability value of the present circuit is determined according to the 2-element unreliability value, 3-element unreliability value, and 4-element unreliability value of the present RD circuit.

Exemplarily, the reliability value M of the present RD circuit may be calculated through the following formula:

$$M = 1 - \min[1, \Sigma_{n=2}^{m} L].$$

L represents the n-element unreliability value of the present RD circuit, and $2 \leq n \leq m$.

If there is the FB in the present RD circuit, S208 may also be executed. In such case, there is the FB in the present RD circuit, it indicates that both the 2-element unreliability value and 3-element unreliability value of the present RD circuit are maximum, and if the maximum value of the unreliability value is 1, it is obtained according to the calculation formula of M that the unreliability value M of the present RD circuit is 0, namely the reliability value of the present RD circuit is minimum when there is the FB in the present RD circuit. Optionally, if there is the FB in the present RD circuit, M may also not be calculated through the formula, and it is directly determined that the reliability value of the present RD circuit is minimum.

Similarly, when the n-element unreliability value of the present RD circuit is equal to the maximum value, S208 is also executed. In such case, it is also obtained according to the calculation formula of M that the reliability value M of the present RD circuit is also 0. When the value of n is 2, and the 2-element unreliability value of the present RD circuit is equal to the maximum value, the 3-element unreliability value of the RD circuit may not be calculated, and in such case, it may be determined that the 3-element unreliability value of the RD circuit is 0.

In S209, the reliability value of the present RD circuit is stored in the RD circuit reliability list.

Figure 9:
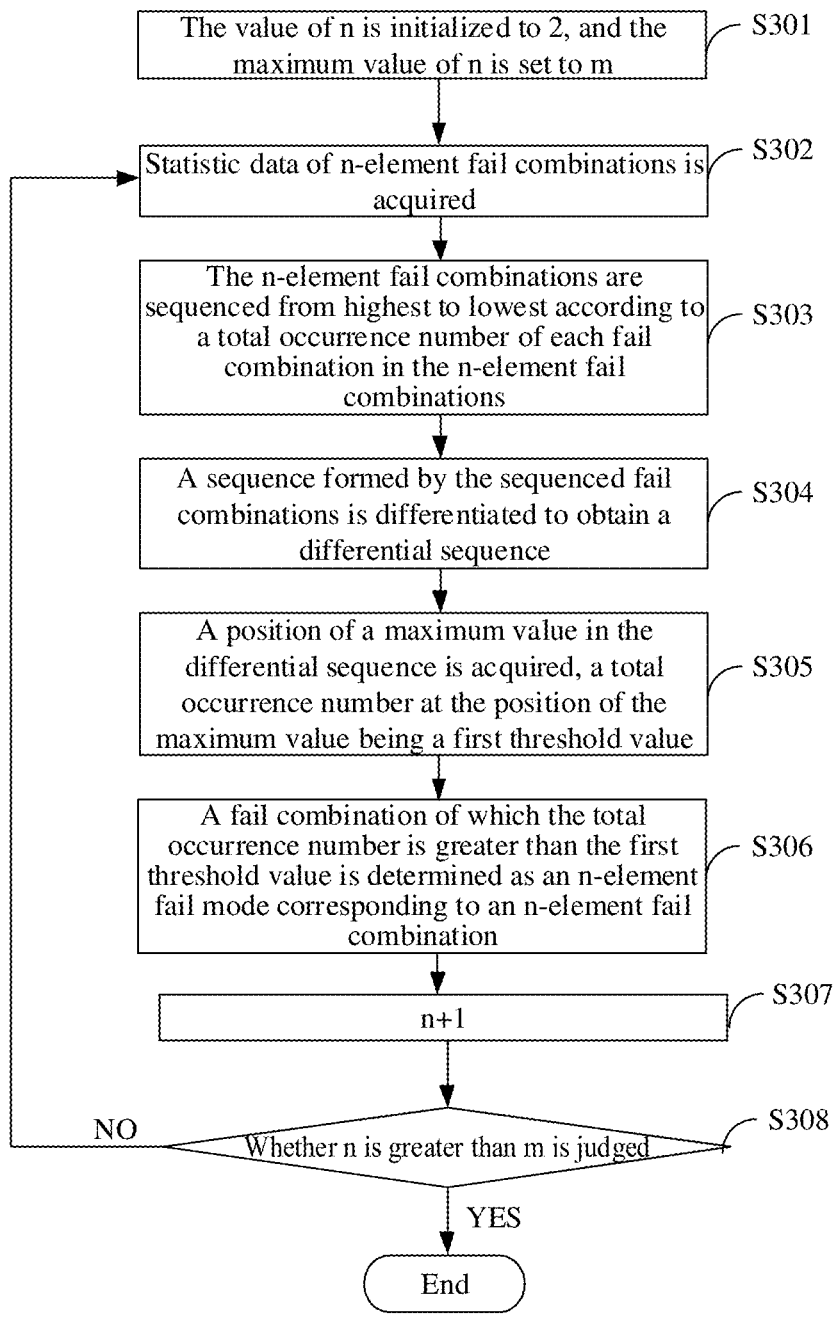
FIG. 9 is a flowchart of a method for determining a fail mode according to embodiment 3 of the disclosure.

Based on embodiment 1 and embodiment 2, embodiment 3 of the disclosure provides a method for determining an n-element fail mode. FIG. 9 is a flowchart of a method for determining a fail mode according to embodiment 3 of the disclosure. As shown in FIG. 9, the method provided in the embodiment includes the following operations.

In S301, the value of n is initialized to 2, and the maximum value of n is set to m.

In S302, statistic data of n-element fail combinations is acquired.

The statistic data of the n-element fail combinations is stored in the database. The statistic data of the n-element fail combinations includes an identifier of each fail combination and a total occurrence number of the fail combination.

In S303, the n-element fail combinations are sequenced from highest to lowest according to a total occurrence number of each fail combination in the n-element fail combinations.

Descriptions are made taking valuing n to 2 as an example. If 2-element fail combinations include 10 fail combinations, the 10 2-element fail combinations are sequenced from highest to lowest according to total occurrence numbers.

In S304, a sequence formed by the sequenced fail combinations is differentiated to obtain a differential sequence.

In S305, a position of a maximum value in the differential sequence is acquired, a total occurrence number at the position of the maximum value being a first threshold value.

In S306, a fail combination of which the total occurrence number is greater than the first threshold value is determined as an n-element fail mode corresponding to an n-element fail combination.

Figure 10:
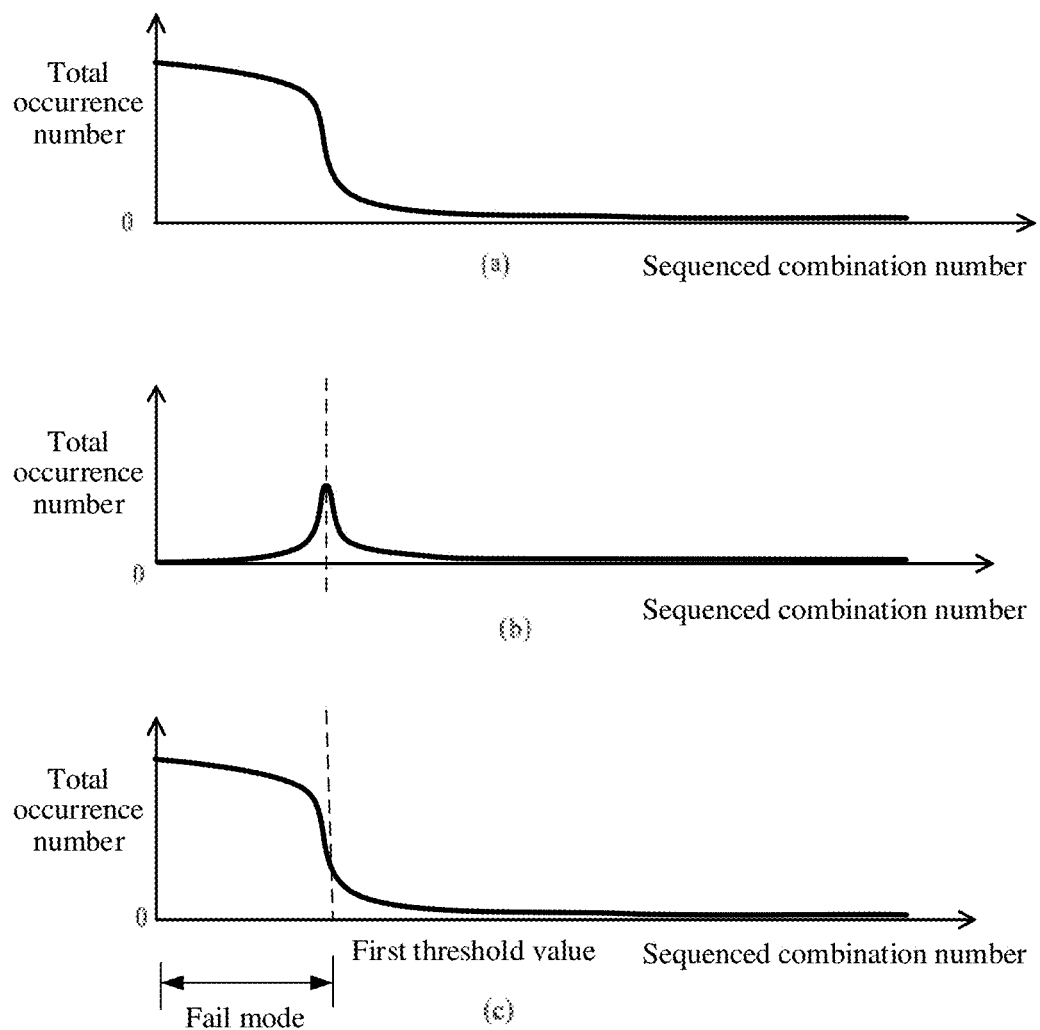
FIG. 10 is a schematic diagram of dynamic variation of a manner for determining a first threshold value.

FIG. 10 is a schematic diagram of dynamic variation of a manner for determining a first threshold value. As shown in FIG. 10, the part (a) is a schematic diagram after the total occurrence numbers of the n-element fail combinations are sequenced. The part (b) is a schematic diagram after the part (a) is differentiated. The part (c) is a schematic diagram of the first threshold value.

In the embodiment, the first threshold value is dynamically acquired through S303 to S304. Optionally, the first threshold value may also be a fixed value, or, is acquired in another manner.

In S307, n is increased by 1.

In S308, whether n is greater than m is judged.

If n is not greater than m, S302 is re-executed. If n is greater than m, the flow is ended. The flow may be cyclically executed to acquire all 2-element to m-element fail modes.

Figure 11:
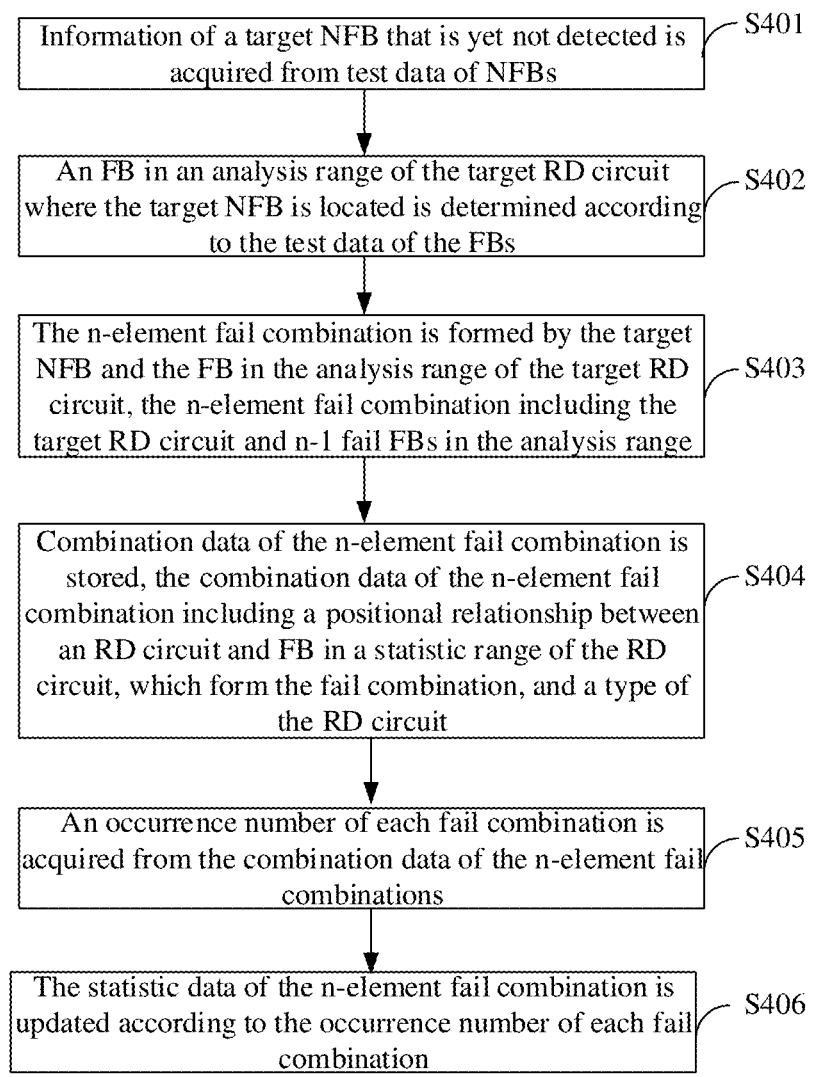
FIG. 11 is a flowchart of a method for creating statistic data according to embodiment 4 of the disclosure.

Based on embodiment 1 to embodiment 3, embodiment 4 of the disclosure provides a statistic data creation method. A process of creating the statistic data is a process of acquiring combination data and statistic data of the n-element fail combination. FIG. 11 is a flowchart of a statistic data creation method according to embodiment 4 of the disclosure. As shown in FIG. 11, the method provided in the embodiment includes the following operations.

In S401, information of a target NFB that is yet not detected is acquired from test data of NFBs.

The NFBs are sequentially read from the test data of the NFBs. A presently read NFB is the target NFB. The information of the target NFB includes a type and position information of a target RD circuit where the NFB is located. The test data of the NFBs includes information of NFBs generated in the RD circuits of the chip. The information of the NFB includes a type and position information of an RD circuit where the NFB is located.

In S402, an FB in an analysis range of the target RD circuit where the target NFB is located is determined according to the test data of the FBs.

In S403, the n-element fail combination is formed by the target NFB and the FB in the analysis range of the target RD circuit, the n-element fail combination including the target RD circuit and n−1 fail FBs in the analysis range.

The minimum number of combination elements of the fail combination is 2. The maximum number of combination elements of the fail combination is related to the number of FBs in the analysis range of the target RD circuit. If the number of the FBs in the analysis range of the target RD circuit is M, the maximum number of the combination elements of the fail combination is 1+M. If M is 4, the maximum number of the combination elements of the fail combination is 5. That is, 2-element fail combinations, 3-element fail combinations, 4-element fail combinations, and a 5-element fail combination may be formed.

In S404, combination data of the n-element fail combination is stored, the combination data of the n-element fail combination including a positional relationship between an RD circuit and FB in a statistic range of the RD circuit, which form the fail combination, and a type of the RD circuit.

Exemplarily, combination data of the 2-element fail combination is arranged as $<x_1, x_2, x_3>$ for storage, and combination data of the 3-element fail combination is arranged as $<x_1, x_2, x_3, x_4>$ for storage, where $x_1$ represents the type of the RD circuit, and $x_2, x_3, x_4$ are configured to represent the positional relationship between the RD circuit and the FB in the statistic range of the RD circuit.

In S405, an occurrence number of each fail combination is acquired from the combination data of the n-element fail combinations.

In S406, the statistic data of the n-element fail combination is updated according to the occurrence number of each fail combination.

The statistic data of the n-element fail combinations includes the identifier and a total occurrence number of the detected n-element fail combinations. When a certain fail combination acquired in S404 has existed, the occurrence number of the fail combination to the total occurrence number of the fail combination in the statistic data of the n-element fail combinations. If a certain fail combination acquired in S404 does not exist, an identifier is generated for the fail combination, and the identifier and occurrence number of the fail combination are added to the statistic data of the n-element fail combinations.

Figure 12:
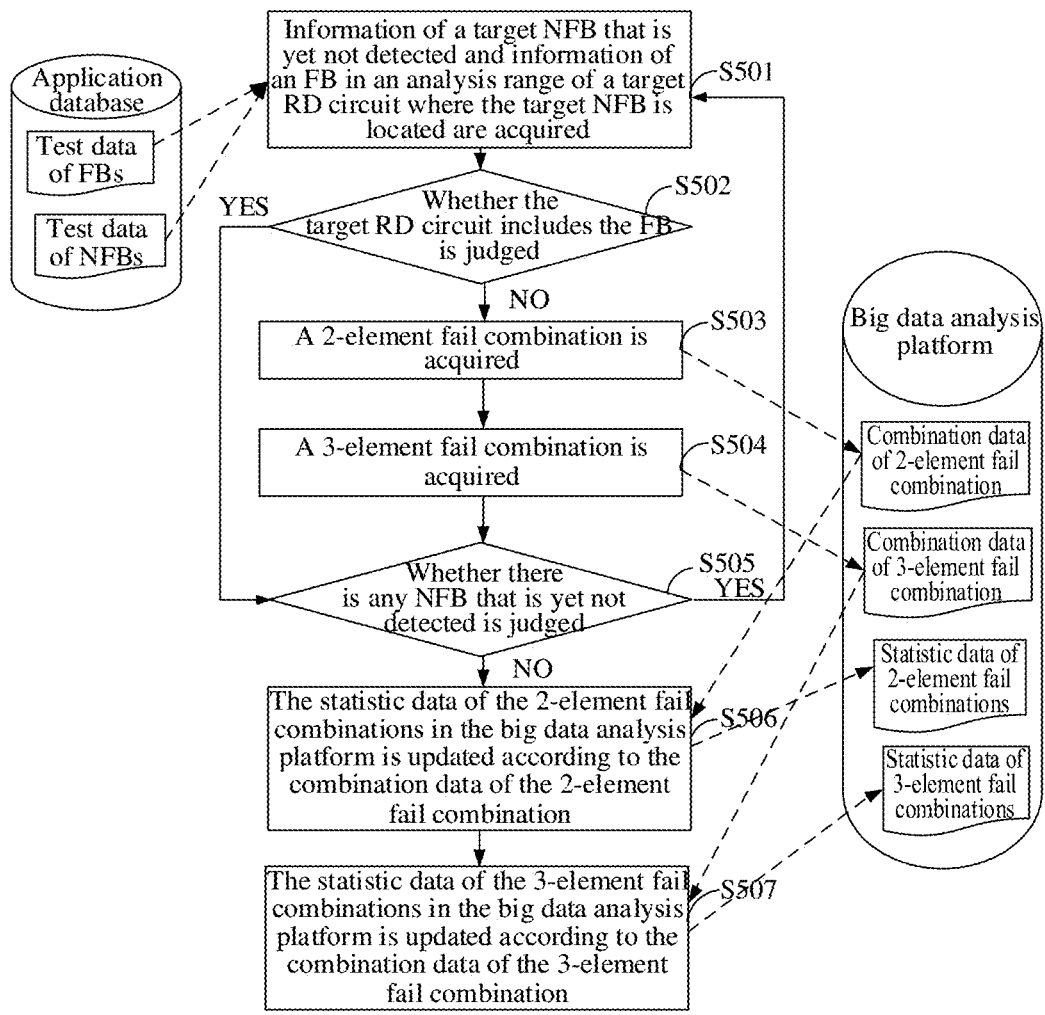
FIG. 12 is a flowchart of a method for creating statistic data according to embodiment 5 of the disclosure.

Based on embodiment 4, embodiment 5 of the disclosure describes a process of creating the combination data and statistic data of the n-element fail combination taking the condition that the maximum value of n is 3, namely the value of n is 2 and 3, as an example. FIG. 12 is a flowchart of a statistic data creation method according to embodiment 5 of the disclosure. As shown in FIG. 12, the method provided in the embodiment includes the following operations.

In S501, information of a target NFB that is yet not detected and information of an FB in an analysis range of a target RD circuit where the target NFB is located are acquired.

The information of the target NFB that is yet not detected is read from the test data of the NFBs, and the information of the FB in the analysis range of the target RD circuit where the target NFB is located is read from the test data of the FBs.

In S502, whether the target RD circuit includes the FB is judged.

Whether the target RD circuit includes the FB may be judged according to the information of the FB in the analysis range of the target RD circuit. If the target RD circuit includes the FB, 505 is executed. If the target RD circuit does not include the FB, S503 is executed.

In S503, a 2-element fail combination is acquired, and combination data of the 2-element fail combination is stored in the big data analysis platform.

If there are four FBs in the analysis range of the target RD circuit, four 2-element fail combinations may be formed, each 2-element fail combination being formed by an NFB and one FB in the target RD circuit.

In S504, a 3-element fail combination is acquired, and combination data of the 3-element fail combination is stored in the big data analysis platform.

When there are four FBs in the analysis range of the target RD circuit, six 3-element fail combinations may be formed, each 3-element fail combination being formed by an NFB and two FBs in the target RD circuit.

In S505, whether there is any NFB that is yet not detected is judged.

If there is an NFB that is yet not detected, S501 is re-executed. If there is no NFB that is yet not detected, S506 is executed.

In S506, the statistic data of the 2-element fail combinations in the big data analysis platform is updated according to the combination data of the 2-element fail combination.

The occurrence number of each fail combination is acquired from the statistic data of the 2-element fail combinations, and the statistic data of the 2-element fail combinations in the big data analysis platform is updated according to the occurrence number of each fail combination. If a certain fail combination has existed in the statistic data of the 2-element fail combinations, the occurrence number of the fail combination is accumulated to the total occurrence number of the same fail combination in the statistic data of the 2-element fail combinations. If a certain fail combination does not exist in the statistic data of the 2-element fail combinations, an identifier is allocated to the fail combination, and the identifier and occurrence number of the fail combination are added to the statistic data of the 2-element fail combinations.

In S507, the statistic data of the 3-element fail combinations in the big data analysis platform is updated according to the combination data of the 3-element fail combination.

The occurrence number of each fail combination is acquired from the statistic data of the 3-element fail combinations, and the statistic data of the 3-element fail combinations in the big data analysis platform is updated according to the occurrence number of each fail combination. A specific updating process is the same as the statistic data of the 2-element fail combinations, and will not be elaborated herein.

In addition, the drawings are only schematic descriptions about processing in the method according to the exemplary embodiments of the disclosure and not for a purpose of limitation. It is easily understood that processing shown in the drawings does not indicate or limit the time sequence of the processing. In addition, it is also easily understood that such processing may be performed, for example, in multiple modules at the same time or at different time.

There is also provided in an exemplary embodiment an electronic device, which includes at least one processor and a memory. The memory stores a computer-executable instruction. The at least one processor executes the computer-executable instruction stored in the memory such that the at least one processor execute the method as described in the method embodiment.

There is also provided in an exemplary embodiment a non-transitory computer-readable storage medium including an instruction. The non-transitory computer-readable storage medium may be a Read-Only Memory (ROM), a Random Access Memory (RAM), a Compact Disc Read-Only Memory (CD-ROM), a magnetic tape, a floppy disk, an optical data storage device, and the like. When the instruction in the storage medium is executed by a processor of an electronic device, the electronic device may execute the method as described in the method embodiment.

An embodiment of the disclosure also provides a computer program product, which includes a computer program. The computer program is executed by a processor to implement the method as described in the method embodiment. A specific implementation manner and technical effects are similar, and will not be elaborated herein.

Other implementation modes of the disclosure are apparent to those skilled in the art after considering the specification and practicing the disclosure disclosed here. The disclosure is intended to cover any transformations, uses or adaptive variations of the disclosure, and these transformations, uses or adaptive variations follow the general principle of the disclosure, and include common general knowledge or conventional technical means undisclosed in the disclosure in the technical field. The specification and the embodiments are only considered as examples.

What is claimed is:

1. A Fail Bit (FB) repair solution determination method, applied to a chip comprising a plurality of subdomains, the chip further comprising Redundancy (RD) circuits, and the RD circuits being configured to repair FBs in the subdomains, wherein the method comprises:
  acquiring a Chip Probe (CP) result of the chip, the CP result comprising position information of FBs in the chip, and the FBs in the chip comprising the FBs in the subdomains and FBs in the RD circuits;
  determining an available RD circuit for repairing a target FB in a subdomain in the CP result;
  acquiring a reliability value of the available RD circuit from a pre-acquired RD circuit reliability list, the RD circuit reliability list comprising reliability values of a plurality of RD circuits; and
  determining a repair solution for the target FB according to the reliability value of the available RD circuit.

2. The FB repair solution determination method of claim 1, before acquiring the reliability value of the available RD circuit from the pre-acquired RD circuit reliability list, further comprising:
  creating the RD circuit reliability list.

3. The FB repair solution determination method of claim 2, wherein creating the RD circuit reliability list comprises:
  determining a reliability value of each RD circuit in the chip according to test data of fail units in the chip and statistic data of detected fail modes in a database, the statistic data of the fail modes comprising identifiers of a plurality of fail combinations and total occurrence numbers of the fail combinations, the fail combination being formed by an RD circuit where a New FB (NFB) is located and at least one FB in a statistic range of the RD circuit where the NFB is located, and the test data of the fail units in the chip comprising a plurality of CP results; and
  storing the reliability value of each RD circuit in the chip in the RD circuit reliability list.

4. The FB repair solution determination method of claim 3, wherein determining the reliability value of each RD circuit in the chip according to the test data of the fail units in the chip and the statistic data of the detected fail modes in the database comprises:
  judging whether there is any FB in a present RD circuit in the chip according to the test data of the fail units;
  in a case where there is an FB in the present RD circuit, determining a reliability value of the present RD circuit;
  in a case where there is no FB in the present RD circuit, initializing a value of n to 2, determining an n-element fail combination of the present RD circuit, and acquiring statistic data of an n-element fail mode, the n-element fail combination being formed by the present RD circuit and at least one FB in a statistic range of the present RD circuit;
  calculating an n-element unreliability value of the present RD circuit according to the n-element fail combination of the present RD circuit and the statistic data of the n-element fail mode;
  in a case where the n-element unreliability value of the present RD circuit is equal to a maximum value, determining the reliability value of the present RD circuit;
  in a case where the n-element unreliability value of the present RD circuit is less than the maximum value, increasing n by 1, and judging whether n is greater than m, m being a maximum value of n;
  in a case where n is not greater than m, re-executing the operation of determining the n-element fail combination of the present RD circuit and acquiring the statistic data of the n-element fail mode; and
  in a case where n is greater than m, determining the reliability value of the present RD circuit according to m−1 n-element unreliability values of the present RD circuit.

5. The FB repair solution determination method of claim 4, wherein the n-element fail combination of the present RD circuit comprises a plurality of n-element fail combinations, and calculating the n-element unreliability value of the present RD circuit according to the n-element fail combination of the present RD circuit and the statistic data of the n-element fail mode comprises:
  for an i-th n-element fail combination of the present RD circuit, in a case where the i-th n-element fail combination belongs to the n-element fail mode, determining that the unreliability of the i-th n-element fail combination is highest, and in a case where the i-th n-element fail combination does not belong to the n-element fail mode, calculating the unreliability of the i-th n-element fail combination according to a following formula: $f_n(x_i, q_i) = q_i \times \max(q)^{-1}$, where $x_i$ represents the i-th n-element fail combination, $q_i$ represents a total occurrence number of the i-th n-element fail combination, and $\max(q)$ represents a maximum value in total occurrence numbers of the n-element fail combinations of the present RD circuit; and
  determining the greater value of a sum of unreliability values of the n-element fail combinations of the present RD circuit and a maximum value of the unreliability values as the n-element unreliability value of the present RD circuit.

6. The FB repair solution determination method of claim 4, wherein determining the reliability value of the present RD circuit according to the m−1 n-element unreliability values of the present RD circuit comprises:
  calculating the reliability value M of the present RD circuit according to a following formula:

$$M = 1 - \min[1, \Sigma_{n=2}^{m} L]$$

where L represents the n-element unreliability value of the present RD circuit.

7. The FB repair solution determination method of claim 4, further comprising:
  acquiring statistic data of n-element fail combinations from the database, the statistic data of the n-element fail combinations comprising an identifier of each fail combination and a total occurrence number of the fail combination; and
  determining n-element fail modes corresponding to the n-element fail combinations according to the statistic data of the n-element fail combinations.

8. The FB repair solution determination method of claim 7, wherein determining n-element fail modes corresponding to the n-element fail combinations according to the statistic data of the n-element fail combinations comprises:
acquiring a first threshold value; and
determining a fail combination of which a total occurrence number is greater than the first threshold value as an n-element fail mode corresponding to the n-element fail combination.

9. The FB repair solution determination method of claim 8, wherein acquiring the first threshold value comprises:
sequencing the n-element fail combinations from highest to lowest according to a total occurrence number of each fail combination in the n-element fail combinations;
differentiating a sequence formed by the sequenced fail combinations to obtain a differential sequence; and
acquiring a position of a maximum value in the differential sequence, a total occurrence number at the position of the maximum value being the first threshold value.

10. The FB repair solution determination method of claim 7, before acquiring the statistic data of the n-element fail combinations from the database, further comprising:
acquiring combination data of the n-element fail combination, the combination data of the n-element fail combination comprising a positional relationship between an RD circuit and FB in a statistic range of the RD circuit, which form the fail combination, and a type of the RD circuit;
acquiring an occurrence number of each fail combination from the combination data of the n-element fail combination; and
updating the statistic data of the n-element fail combination according to the occurrence number of each fail combination.

11. The FB repair solution determination method of claim 10, wherein acquiring the combination data of the n-element fail combination comprises:
acquiring information of a target new fail unit that is yet not detected from test data of new fail units in the chip, the information of the target new fail unit comprising a type and position information of a target RD circuit where the target new fail unit is located, the test data of the new fail units comprising information of new fail units generated in RD circuits of a plurality of chips, and the information of the new fail unit comprising a type and position information of an RD circuit where the new fail unit is located;
determining a fail unit in an analysis range of the target RD circuit where the target new fail unit is located according to the test data of the fail units; and
forming the n-element fail combination by the target new fail unit and the FB in the analysis range of the target RD circuit, the n-element fail combination comprising the target new fail unit and n−1 fail units.

12. The FB repair solution determination method of claim 11, wherein, in a case where the target RD circuit is a Redundant Word Line (RWL), the analysis range of the target RD circuit is a target global domain to which the target RD circuit belongs and an adjacent global domain of the target global domain, wherein a plurality of continuous subdomains in a word line direction form one global domain of the chip.

13. The FB repair solution determination method of claim 11, wherein, in a case where the target RD circuit is a Redundant Bit Line (RBL), the analysis range of the target RD circuit is a target subdomain to which the target RD circuit belongs and an adjacent subdomain of the target subdomain, wherein a plurality of continuous subdomains in a word line direction form one global domain of the chip.

14. The FB repair solution determination method of claim 1, wherein, in a case where there are a plurality of available RD circuits for the target FB, determining the repair solution for the target FB according to the reliability value of the available RD circuit comprises:
selecting an available RD circuit with a highest reliability value from the plurality of available RD circuits according to reliability values of the available RD circuits to repair the target FB.

15. The FB repair solution determination method of claim 14, wherein the reliability value of the RD circuit is more than or equal to 0 and less than or equal to 1, wherein the higher reliability value indicates the more reliable RD circuit.

16. The FB repair solution determination method of claim 1, wherein determining the available RD circuit for repairing the target FB in the subdomain in the CP result comprises:
determining the available RD circuit for repairing the target FB according to a position of the target FB, and a number and types of the remaining unallocated RD circuits in the chip.

17. An electronic device, comprising a processor and a memory, wherein
the memory is configured to store a program code; and
the processor is configured to call the program code stored in the memory to:
acquire a Chip Probe (CP) result of a chip, the CP result comprising position information of FBs in the chip, and the FBs in the chip comprising the FBs in subdomains and Fail Bits (FBs) in the Redundancy (RD) circuits;
determine an available RD circuit for repairing a target FB in a subdomain in the CP result;
acquire a reliability value of the available RD circuit from a pre-acquired RD circuit reliability list, the RD circuit reliability list comprising reliability values of a plurality of RD circuits; and
determine a repair solution for the target FB according to the reliability value of the available RD circuit.

18. A computer-readable nonvolatile storage medium, storing an instruction therein, the instruction running in a computer to enable the computer to:
acquire a Chip Probe (CP) result of the chip, the CP result comprising position information of FBs in the chip, and the FBs in the chip comprising the FBs in subdomains and Fail Bits (FBs) in the Redundancy (RD) circuits;
determine an available RD circuit for repairing a target FB in a subdomain in the CP result;
acquire a reliability value of the available RD circuit from a pre-acquired RD circuit reliability list, the RD circuit reliability list comprising reliability values of a plurality of RD circuits; and
determine a repair solution for the target FB according to the reliability value of the available RD circuit.

* * * * *